United States Patent
Tao et al.

(10) Patent No.: US 9,231,024 B2
(45) Date of Patent: Jan. 5, 2016

(54) LIGHT-EMITTING ELEMENT AND THE MANUFACTURING METHOD THEREOF

(75) Inventors: Ching-San Tao, Hsinchu (TW); Ting-Chia Ko, Tainan (TW); De-Shan Kuo, Tainan (TW); Tsun-Kai Ko, Tainan (TW)

(73) Assignee: EPISTAR CORPORATION, Hsinchu (TW)

( * ) Notice: Subject to any disclaimer, the term of this patent is extended or adjusted under 35 U.S.C. 154(b) by 34 days.

(21) Appl. No.: 13/242,495

(22) Filed: Sep. 23, 2011

(65) Prior Publication Data

US 2012/0074379 A1 Mar. 29, 2012

(30) Foreign Application Priority Data

Sep. 23, 2010 (TW) .............................. 99132428 A

(51) Int. Cl.
*H01L 33/00* (2010.01)
*H01L 27/15* (2006.01)
*H01L 33/22* (2010.01)

(52) U.S. Cl.
CPC .............. *H01L 27/153* (2013.01); *H01L 33/007* (2013.01); *H01L 33/22* (2013.01)

(58) Field of Classification Search
USPC ........... 257/79, 88, 89, 90, 93, 94, 95, 96, 99, 257/103, E33.002, E33.003, E33.048, 257/E33.056, E33.058, E33.066
See application file for complete search history.

(56) References Cited

U.S. PATENT DOCUMENTS

| | | | | |
|---|---|---|---|---|
| 3,290,539 A * | 12/1966 | Lamorte | ........................ | 313/114 |
| 4,925,811 A * | 5/1990 | Menigaux et al. | .............. | 438/33 |
| 4,955,030 A * | 9/1990 | Menigaux et al. | ......... | 372/44.01 |
| 5,930,279 A * | 7/1999 | Apollonov et al. | ........ | 372/50.12 |
| 6,740,904 B2 * | 5/2004 | Kim et al. | ......... | 257/86 |
| 6,936,856 B2 * | 8/2005 | Guenther et al. | ............... | 257/89 |
| 7,192,794 B2 * | 3/2007 | Ying et al. | ...... | 438/22 |
| 7,638,808 B2 * | 12/2009 | Owen et al. | ...................... | 257/88 |
| 7,682,944 B2 * | 3/2010 | Brandes et al. | ............... | 438/478 |
| 7,683,386 B2 * | 3/2010 | Tanaka et al. | ................... | 257/88 |
| 7,897,981 B2 * | 3/2011 | Lee | ................... | 257/88 |
| 8,026,527 B2 | 9/2011 | Hasnain et al. | | |
| 8,067,777 B2 * | 11/2011 | Fjelstad | ........................ | 257/88 |
| 8,089,079 B2 * | 1/2012 | Lee | ................... | 257/89 |
| 8,256,930 B2 * | 9/2012 | Cheng et al. | .................. | 362/307 |
| 8,288,781 B2 * | 10/2012 | Seo et al. | ........................ | 257/88 |
| 8,297,793 B2 * | 10/2012 | Kim | ........................ | 362/249.06 |
| 8,338,839 B2 * | 12/2012 | Lerman et al. | .................. | 257/88 |
| 8,344,411 B2 * | 1/2013 | Chou et al. | ........................ | 257/99 |
| 8,368,190 B2 * | 2/2013 | Lee et al. | ........................ | 257/666 |
| 8,384,096 B2 * | 2/2013 | Herrmann | ........................ | 257/88 |
| 8,592,236 B2 * | 11/2013 | Albrecht et al. | ................ | 438/31 |
| 2008/0042551 A1 | 2/2008 | Yen et al. | | |
| 2008/0128716 A1 * | 6/2008 | Tazima et al. | .................. | 257/88 |
| 2009/0201662 A1 * | 8/2009 | Kim | ................ | 362/84 |

(Continued)

FOREIGN PATENT DOCUMENTS

TW 200910716 A 3/2009
TW 200913315 A 3/2009

(Continued)

*Primary Examiner* — Michael Shingleton
(74) *Attorney, Agent, or Firm* — Muncy, Geissler, Olds & Lowe P.C.

(57) ABSTRACT

A light-emitting element includes: a substrate being a monocrystalline structure, comprising a plurality of recesses; and a plurality of first light-emitting stacks formed in the recesses respectively.

19 Claims, 6 Drawing Sheets

(56) References Cited

U.S. PATENT DOCUMENTS

| | | | |
|---|---|---|---|
| 2010/0001375 A1* | 1/2010 | Yu et al. | 257/615 |
| 2010/0096650 A1* | 4/2010 | Ubahara | 257/94 |
| 2011/0017972 A1* | 1/2011 | O'Keefe | 257/13 |
| 2011/0024772 A1* | 2/2011 | Diamantidis | 257/88 |
| 2011/0086453 A1* | 4/2011 | Kim et al. | 438/31 |
| 2011/0089444 A1* | 4/2011 | Yao et al. | 257/93 |
| 2012/0025228 A1* | 2/2012 | Hsieh et al. | 257/89 |
| 2012/0056212 A1* | 3/2012 | Huang et al. | 257/88 |
| 2012/0074531 A1* | 3/2012 | Tu et al. | 257/622 |
| 2012/0097996 A1* | 4/2012 | Lee et al. | 257/88 |
| 2012/0104449 A1* | 5/2012 | Ryu et al. | 257/99 |
| 2012/0127718 A1* | 5/2012 | Kim et al. | 362/249.01 |
| 2012/0168715 A1* | 7/2012 | Horng et al. | 257/13 |
| 2012/0171851 A1* | 7/2012 | Yu et al. | 438/478 |

FOREIGN PATENT DOCUMENTS

| | | |
|---|---|---|
| TW | 200926461 A | 6/2009 |
| TW | I314789 B | 9/2009 |

\* cited by examiner

LIGHT-EMITTING ELEMENT AND THE MANUFACTURING METHOD THEREOF

REFERENCE TO RELATED APPLICATION

The application further claims the right of priority based on TW application Ser. No. 099132428 filed on Sep. 23, 2010, which is incorporated herein by reference and assigned to the assignee herein in its entirety.

TECHNICAL FIELD

The application relates to a light-emitting element and the manufacturing method thereof.

DESCRIPTION OF BACKGROUND ART

The lighting theory and the structure of light-emitting diode (LED) is different from that of the conventional lighting source. The LED has advantages as a low power loss, a long life-time, no need for warming time, and fast responsive time. Moreover, it is small, shockproof, suitable for mass production, and highly compatible with the demand of a tiny or array-type element in many applications, so LEDs are widely adopted in the market. For example, LEDs can be used in optical display apparatus, laser diodes, traffic lights, data storage devices, communication devices, illumination devices, medical devices, and so on.

As shown in FIG. 1, a conventional light-emitting array includes: a sapphire substrate 10; a plurality of light-emitting stacks 12 formed on the sapphire substrate 10 and including a p-type semiconductor layer 121, an active layer 122, and an n-type semiconductor layer 123. Because the sapphire substrate 10 is insulative, the light-emitting stacks can be insulated from each other by forming trenches therebetween with etching processes. Furthermore, after partially etching the plurality of light-emitting stacks 12 to the n-type semiconductor layer 123, a first electrode 18 is formed on the exposed area of the n-type semiconductor layer 123, and a second electrode 16 is formed on the p-type semiconductor layer 121. Metal wires 19 are then provided to selectively connect the first electrode 18 and the second electrode 16 to connect the plurality of light-emitting stacks 12 in parallel or series configuration.

SUMMARY OF THE DISCLOSURE

A light-emitting element includes: a substrate being a monocrystalline structure, including a plurality of recesses; and a plurality of first light-emitting stacks formed in the recesses respectively.

A method for manufacturing a light-emitting element includes steps of: providing a substrate being monocrystalline structure; forming a plurality of recesses and a protrusion portion by removing a portion of the substrate; and forming a plurality of first light-emitting stacks in the plurality of recesses correspondingly.

DETAILED DESCRIPTION OF PREFERRED EMBODIMENTS

Figure 1:
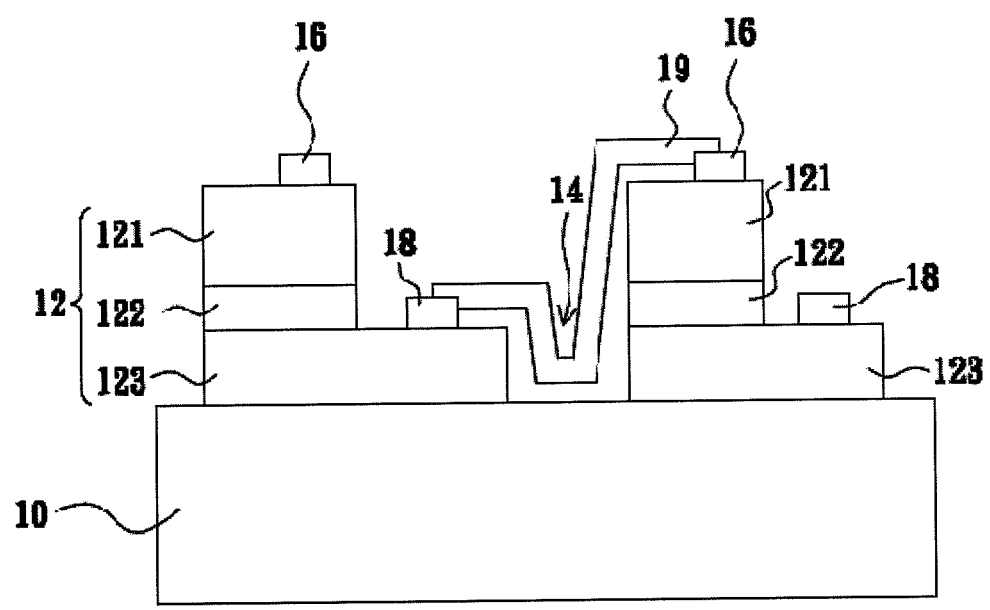
FIG. 1 illustrates a light-emitting element of a conventional light-emitting element.
Figure 2A:
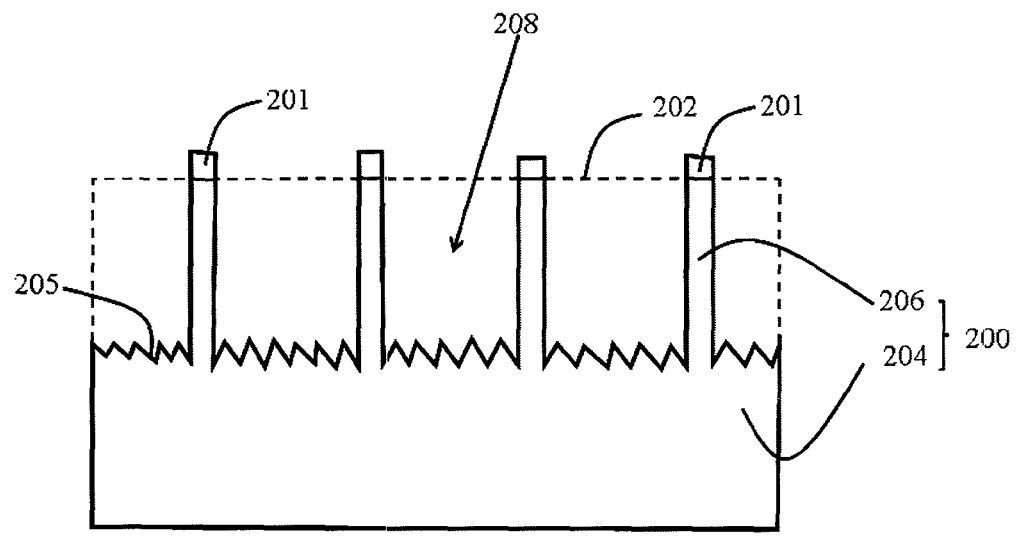
FIGS. 2A to 2E shows a manufacturing method of a light-emitting element of a first embodiment of the present application.
Figure 2B:
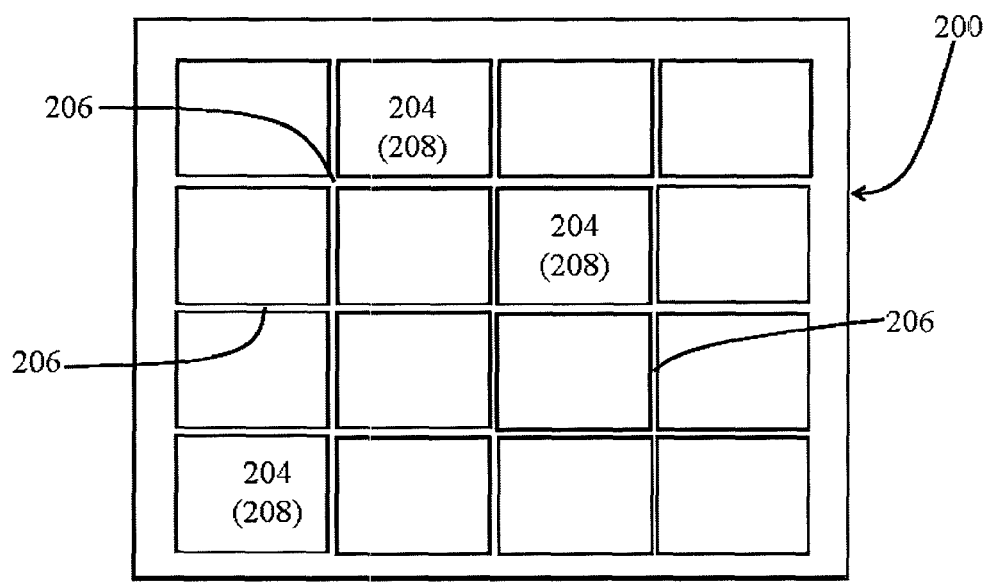
Figure 2C:
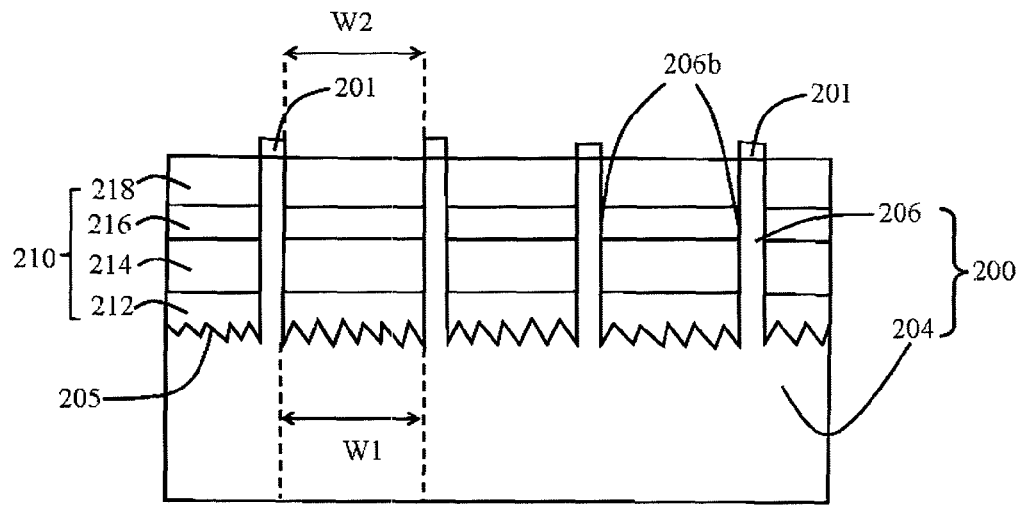
Figure 2D:
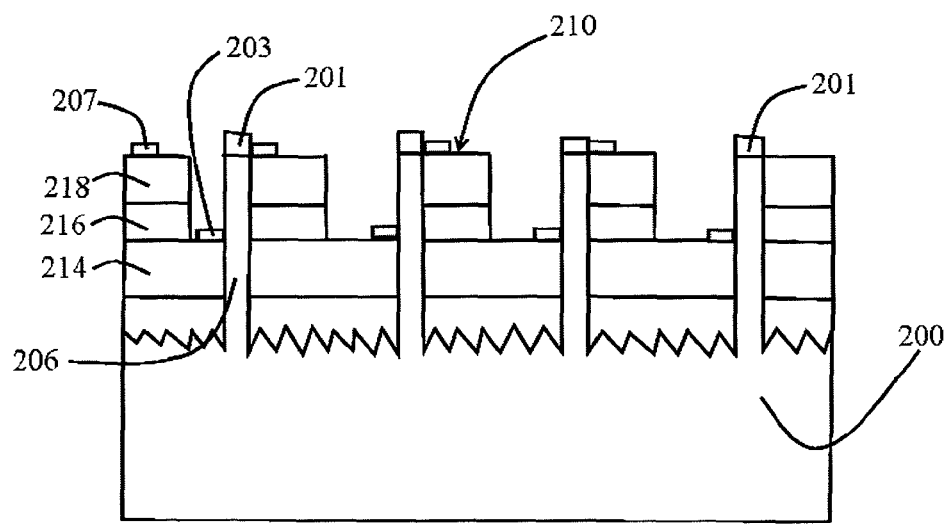
Figure 2E:
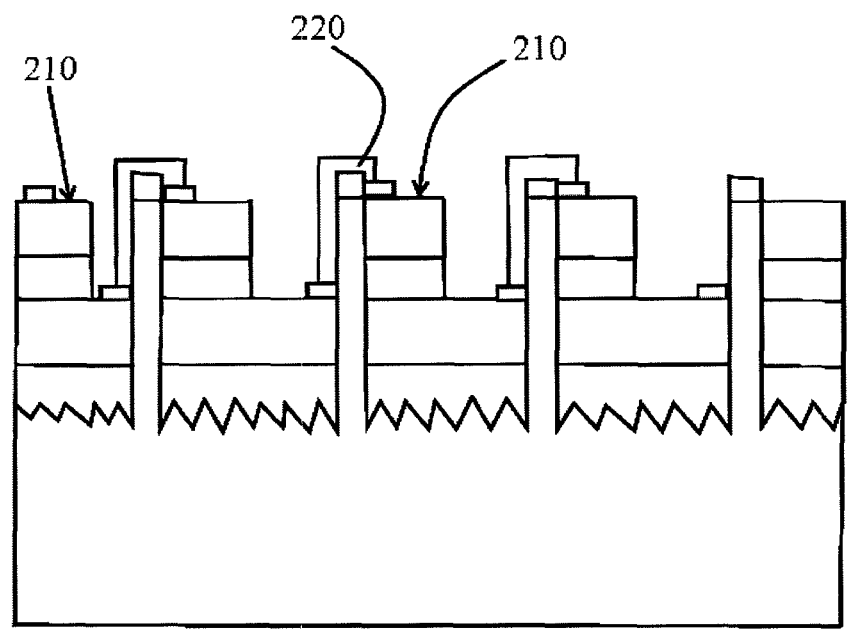

As shown in FIGS. 2A to 2E, a manufacturing method of a light-emitting element of a first embodiment of the present application is disclosed. Referring to FIGS. 2A and 2B, a substrate 200 being a monocrystalline structure for epitaxial growth is provided, and then patterning the substrate 200 from the upper surface 202 thereof. The details of the patterning process include: forming a mask 201 composed of dielectric material such as $Si_3N_4$ on the upper surface 202; and performing a first etching process on the upper surface 202 of the substrate 200 to form a plurality of the recesses 208 defined by a base portion 204 and a protrusion portion 206 protruded from the base portion 204. In the embodiment, a plurality of the protrusion portions 206 forms a mesh to define a plurality of the recesses 208. The first etching process can be a wet etching process or a dry etching process such as ICP (Inductive Coupling Plasma). The base portion 204 can be patterned while forming the protrusion portion 206, and an uneven surface 205 for scattering light is formed on each of the base portions 204. The substrate 200 has a monocrystalline structure and is insulative with a dielectric constant (k) greater than 7.8, and the material thereof comprises sapphire, glass, or the like. The width of the protrusion portion 206 can be equal to or greater than 0.5 μm. Referring to FIG. 2C, a plurality of light-emitting stacks 210 is formed in the plurality of recesses 208 correspondingly, and each of the light-emitting stacks 210 includes a buffer layer 212 formed on the base portion 204, a first semiconductor layer 214 formed on the buffer layer 212, an active layer 216 formed on the first semiconductor layer 214, and a second semiconductor layer 218 formed on the active layer 216. The width W1 of the base portion 204 is substantially the same as the width W2 of the light-emitting stack 210 formed thereon. The plurality of light-emitting stacks 210 can be epitaxially grown on the substrate 200 by MOCVD, and the protrusion portion 206 with the mask 201 remained on is not available for epitaxial growth, so that each of the light-emitting stacks 210 does not exceed the top of the protrusion portion 206 after epitaxial growth. When the substrate 200 is a sapphire substrate, the bottom surface of the recess 208 can be a surface of c-plane. The light-emitting stacks 210 can be exclusively grown from the uneven surface 205 but prevented growing from the side surface 206b of the protrusion 206 by providing a high-temperature and high-pressure condition during epitaxial growth Referring to FIG. 2D, performing a second etching process that removes partial region of the second semiconductor layer 218 and the active layer 216 of each of the plurality of light-emitting stacks 210, and defining a first contact region 203 on the first semiconductor layer 214 and a second contact region 207 on the second semiconductor layer 218 of each of the plurality of light-emitting stacks 210. The first contact region 203 and the second contact region 207 are on the same side of the substrate 200, and the first contact region 203 and the second contact region 207 can be electrodes. Each of the first semiconductor layer 214, the second semiconductor layer 218, and the active layer 216 can be composed of materials such as the series of aluminum gallium indium phosphide (AlGaInP), the series of aluminum gallium indium nitride (AlGaInN), and/or the series of zinc oxide (ZnO). The active layer 216 can be configured to be a single heterostructure (SH), a double heterostructure (DH), a double-side double heterostructure (DDH), or a multi-quantum well (MQW). Besides, the wavelength of the emitted light can be also adjusted by changing the number of the pairs of the quantum well. Referring to FIG. 2E, a plurality of conductive structures 220 is formed between each of the plurality of light-emitting stacks 210. The plurality of conductive structures 220 can connect the plurality of light-emitting stacks 210 in serial and/or parallel.

Figure 3A:
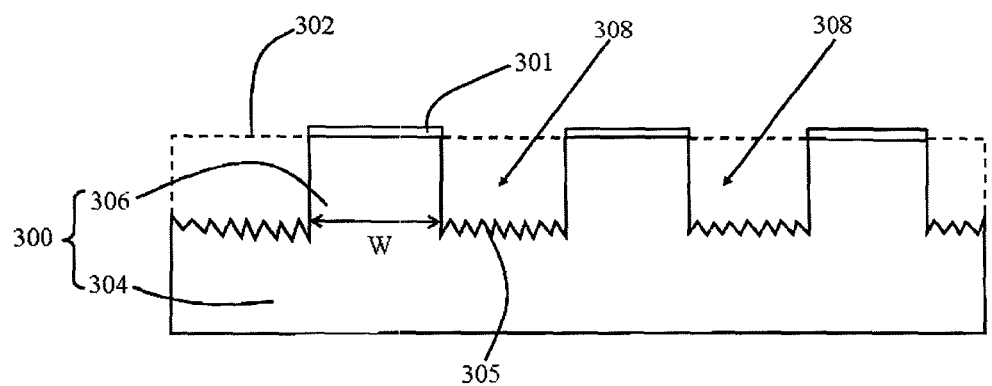
FIGS. 3A to 3D shows a manufacturing method of a light-emitting element of a second embodiment of the present application.
Figure 3B:
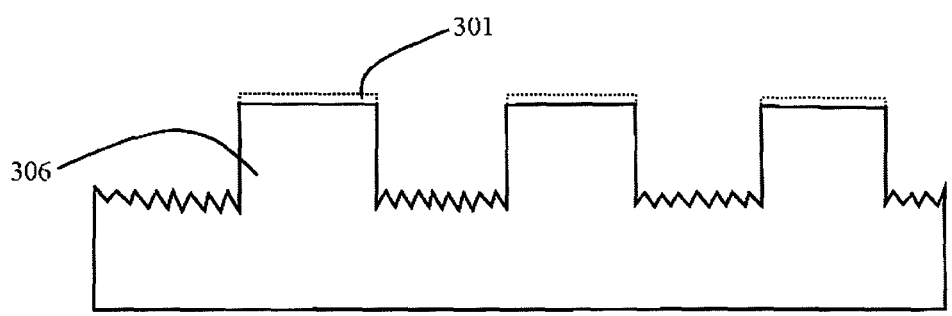
Figure 3C:
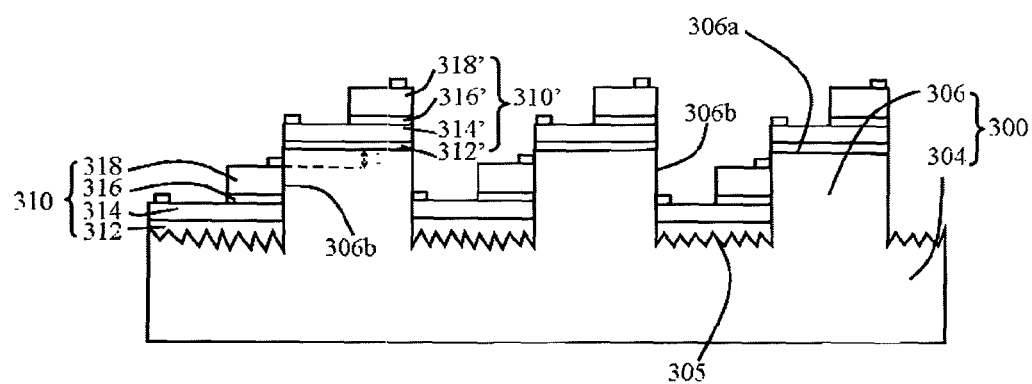
Figure 3D:
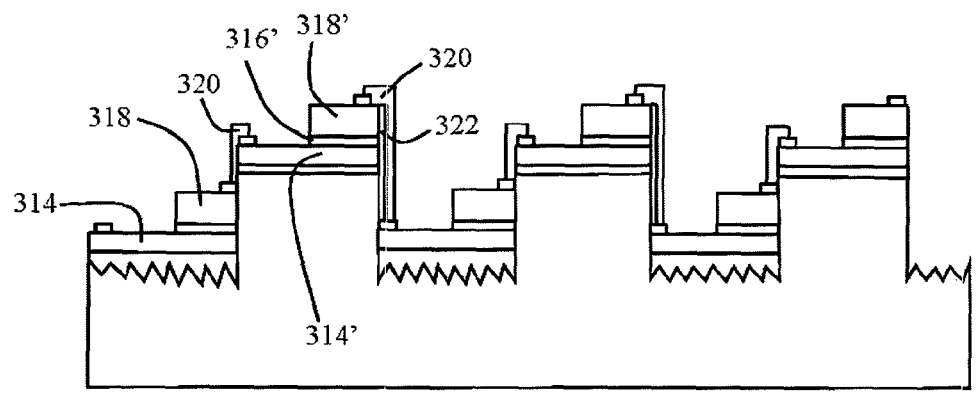

Referring to FIGS. 3A to 3D, a manufacturing method of a light-emitting element of a second embodiment of the present application is disclosed. Referring to FIG. 3A, a substrate 300 being a monocrystalline structure for epitaxial growth is provided, and then patterning the substrate 300 from the upper surface 302 thereof. The details of the patterning process include: forming a mask 301 composed of dielectric material such as $Si_3N_4$ on the upper surface 302; performing a first etching process on the upper surface 302 of the substrate 300 to form a plurality of recesses 308 defined by a base portion 304 and a protrusion portion 306 protruded from the base portion 304. In the embodiment, a plurality of the protrusion portions 306 forms a mesh, and the width W of the protrusion portion 306 is between 35 μm and 250 μm. The first etching process can be a wet etching process or a dry etching process such as ICP (Inductive Coupling Plasma). The base portion 304 is patterned while forming the protrusion portion 306, and an uneven surface 305 for scattering light is formed on the base portion 304. Referring to FIG. 3B, removing the mask 301 on the protrusion portion 306. Referring to FIG. 3C, a plurality of first light-emitting stacks 310 in the plurality of recesses 308 correspondingly and a plurality of second light-emitting stacks 310' separately on the protrusion portion 306 are formed. The distance 1 between the top of the first light-emitting stack 310 and the top surface 306a of the protrusion portion 306 is about 5~20 μm. When the substrate 300 is a sapphire substrate, the bottom surface 308a of the recess 308 and the top surface 306a of the protrusion portion 306 can be a surface of c-plane. The first light-emitting stacks 310 can be exclusively grown from the bottom surface 308a but prevented growing from the side surface 306b of the protrusion 306 by providing a high-temperature and high-pressure condition during epitaxial growth. Each of the first light-emitting stacks 310 includes a buffer layer 312 formed on the base portion 304, a first semiconductor layer 314 formed on the buffer layer 312, an active layer 316 formed on the first semiconductor layer 314, and a second semiconductor layer 318 formed on the active layer 316. Each of the second light-emitting stacks 310' includes a buffer layer 312' formed on the protrusion portion 306, a first semiconductor layer 314' formed on the buffer layer 312', an active layer 316' formed on the first semiconductor layer 314', and a second semiconductor layer 318' formed on the active layer 316'. The plurality of first light-emitting stacks 310 and second light-emitting stacks 310' can be epitaxially grown on the substrate 300 by MOCVD. Referring to FIG. 3D, forming a plurality of conductive structures 320 and 320' between each of the plurality of first light-emitting stacks 310 and second light-emitting stacks 310'. The plurality of conductive structures 320 and 320' connect the plurality of first light-emitting stacks 310 and second light-emitting stacks 310' in serial and/or parallel. As shown in FIG. 3D, the plurality of first light-emitting stacks 310 and the second light-emitting stacks 310' are connected in serial, and each of the conductive structures 320 connects the second semiconductor layer 318 of the first light-emitting stack 310 and the first semiconductor layer 314' of the second light-emitting stack 310', and each of the conductive structures 320' connects the second semiconductor layer 318' of the second light-emitting stack 310' and the first semiconductor layer 314 of the second light-emitting stack 310'. Each of the conductive structures 320' covers the side surface of the active layer 316' of the second light-emitting stack 310', and an insulating layer 322 such as $SiO_2$ or other insulating materials can be firstly formed on the side surface of each of the second light-emitting stacks 310' before forming the conductive structures 320'. In other words, the insulating layer 322 is formed between the second light-emitting stack 310' and the conductive structures 320'.

Although the present application has been explained above, it is not the limitation of the range, the sequence in practice, the material in practice, or the method in practice. Any modification or decoration for present application is not detached from the spirit and the range of such.

What is claimed is:

1. A light-emitting element comprising:
   a substrate of a monocrystalline structure, comprising a plurality of recesses, each recess comprising a bottom surface and a side surface; and
   a plurality of first light-emitting stacks, each first light-emitting stack comprising an epitaxial layer substantially parallel with the bottom surface and directly contacting the bottom surface and the side surface.

2. The light-emitting element of claim 1, wherein the substrate comprises a base portion and at least a protrusion portion protruded from the base portion defining the plurality of recesses.

3. The light-emitting element of claim 2, wherein the base portion comprises an uneven surface.

4. The light-emitting element of claim 1, wherein each of the first light-emitting stacks comprises two contact regions on the same side of the substrate.

5. The light-emitting element of claim 4, further comprising a conductive structure electrically connecting a first contact region of one first light-emitting stack to a second contact region of another first light-emitting stack.

6. The light-emitting element of claim 2, further comprising a second light-emitting stack formed on the protrusion portion.

7. The light-emitting element of claim 6, wherein each of the first light-emitting stacks and the second light-emitting stacks comprise two contact regions on the same side of the substrate.

8. The light-emitting element of claim 7, wherein the distance between the top of the first light-emitting stack and the top surface of each of the protrusion portion is between 5 and 20 μm.

9. The light-emitting element of claim 6, further comprising a conductive structure connecting the first light-emitting stack and the second light-emitting stack, wherein the second light-emitting stack comprises an active layer for emitting light, and the active layer comprises a side surface covered by the conductive structure.

10. The light-emitting element of claim 9, further comprising an insulating layer between the second light-emitting stack and the conductive structure.

11. The light-emitting element of claim 2, wherein the width of the protrusion portion is between 35 μm and 250 μm.

12. The light-emitting element of claim 1, wherein the dielectric constant of the substrate is greater than 7.8.

13. The light-emitting element of claim 2, wherein a width of one of the base portions is substantially the same as a width of the first light-emitting stack formed thereon.

14. The light-emitting element of claim 2, wherein each of the first light-emitting stacks comprises a conductive structure electrically connecting one first light-emitting stack to an another first light-emitting stack and electrically isolated from the protrusion portion of the substrate.

15. The light-emitting element of claim 2, wherein the base portion and the protrusion portion are an integral whole.

16. The light-emitting element of claim 2, wherein there is no space between the first light-emitting stack and the protrusion portion.

17. The light-emitting element of claim 5, wherein the conductive structure upwardly extends along the side surface of the substrate.

18. The light-emitting element of claim 5, wherein the conductive structure strides over a protrusion portion the substrate.

19. The light-emitting element of claim 6, wherein the protrusion portion and the second light-emitting stack substantially have a same width.

* * * * *